(12) United States Patent
Berman et al.

(10) Patent No.: US 11,626,168 B2
(45) Date of Patent: Apr. 11, 2023

(54) DE-NOISING USING MULTIPLE THRESHOLD-EXPERT MACHINE LEARNING MODELS

(71) Applicant: SAMSUNG ELECTRONICS CO., LTD., Suwon-si (KR)

(72) Inventors: Amit Berman, Haifa (IL); Evgeny Blaichman, Tel Aviv (IL); Ron Golan, Shoham (IL); Sergey Gendel, Haifa (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/197,617

(22) Filed: Mar. 10, 2021

(65) Prior Publication Data
US 2022/0293192 A1 Sep. 15, 2022

(51) Int. Cl.
| | | |
|---|---|---|
| *G06F 11/00* | (2006.01) | |
| *G11C 16/26* | (2006.01) | |
| *G11C 16/04* | (2006.01) | |
| *G06F 11/10* | (2006.01) | |
| *G06F 3/06* | (2006.01) | |
| *G06N 20/00* | (2019.01) | |
| *G11C 16/08* | (2006.01) | |

(52) U.S. Cl.
CPC ............ *G11C 16/26* (2013.01); *G06F 3/0604* (2013.01); *G06F 3/0659* (2013.01); *G06F 3/0679* (2013.01); *G06F 11/1068* (2013.01); *G11C 16/0483* (2013.01); *G06N 20/00* (2019.01); *G11C 16/08* (2013.01)

(58) Field of Classification Search
CPC ......... G11C 16/26; G11C 16/04; G11C 29/04; G06F 3/064; G06F 11/1044; G06F 11/1068; G06F 3/0679; G06F 3/0659; G06F 3/0604
See application file for complete search history.

(56) References Cited

U.S. PATENT DOCUMENTS

| | | | | |
|---|---|---|---|---|
| 10,446,246 | B2 * | 10/2019 | Tran ................... | G11C 16/0425 |
| 10,460,818 | B2 * | 10/2019 | Cohen ................ | G11C 16/3495 |
| 10,734,087 | B2 * | 8/2020 | Cohen ................ | G01R 19/0084 |
| 10,861,562 | B1 * | 12/2020 | Xiong ....................... | G06N 3/08 |
| 10,866,856 | B2 * | 12/2020 | Lee ....................... | G06F 11/1068 |

(Continued)

*Primary Examiner* — Esaw T Abraham
(74) *Attorney, Agent, or Firm* — F. Chau & Associates, LLC

(57) ABSTRACT

Systems and methods of the present disclosure may be used to improve equalization module architectures for NAND cell read information. For example, embodiments of the present disclosure may provide for de-noising of NAND cell read information using a Multiple Shallow Threshold-Expert Machine Learning Models (MTM) equalizer. An MTM equalizer may include multiple shallow machine learning models, where each machine learning model is trained to specifically solve a classification task (e.g., a binary classification task) corresponding to a weak decision range between two possible read information values for a given NAND cell read operation. Accordingly, during inference, each read sample with a read value within a weak decision range is passed through a corresponding shallow machine learning model (e.g., a corresponding threshold expert) that is associated with (e.g., trained for) the particular weak decision range.

15 Claims, 10 Drawing Sheets

(56) References Cited

U.S. PATENT DOCUMENTS

| | | | | |
|---|---|---|---|---|
| 11,024,391 | B1* | 6/2021 | Steiner | G06F 11/1024 |
| 11,086,569 | B2* | 8/2021 | Ng | G11C 16/26 |
| 11,145,357 | B2* | 10/2021 | Kim | G11C 11/409 |
| 11,177,831 | B2* | 11/2021 | Sandell | G06K 9/6274 |
| 11,355,203 | B2* | 6/2022 | Alhussien | G11C 29/20 |
| 11,393,539 | B2* | 7/2022 | Bhatia | G06N 3/063 |

* cited by examiner

DE-NOISING USING MULTIPLE THRESHOLD-EXPERT MACHINE LEARNING MODELS

BACKGROUND

The following relates generally to flash memory de-noising, and more specifically to flash memory de-noising using machine learning models.

Memory devices are commonly used electronic components for storing data. NAND flash memory devices allow several bits of data to be stored in each memory cell, providing improvements in manufacturing costs and performance. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels.

However, storing multiple bits per memory cell may decrease the dynamic voltage range of each voltage state, making the memory cells more susceptible to noise. Compensating for this noise may require increased computational power, which may hinder performance in a mobile device. Therefore. There is a need in the art for reliable, low power multi-cell memory systems for use in mobile electronic devices.

SUMMARY

A method for reading data from a memory device is described. Embodiments of the method may read a block of data from a memory device (e.g., a NAND cell), process the block of data using an equalizer with multiple shallow threshold-expert machine learning models to classify each bit of the block of data with a log likelihood ratio (LLR) value, and decode the block of data based on an error correction code (ECC) coding scheme.

A method, apparatus, non-transitory computer readable medium, and system for flash memory de-noising using machine learning models are described. Embodiments of the method, apparatus, non-transitory computer readable medium, and system are configured to receive read information for a memory cell of a memory device, select a threshold network from a plurality of threshold networks based on the read information, wherein each of the threshold networks corresponds to at least one weak decision voltage range from a plurality of weak decision voltage ranges of the memory cell, and generate an improved memory channel output from the read information using the selected threshold network.

An apparatus, system, and method for flash memory de-noising using machine learning models are described. Embodiments of the apparatus, system, and method are configured to a voltage detector configured to detect voltage information from a memory cell, a plurality of threshold networks configured to estimate a channel output of the memory cell based on the detected voltage information, wherein each of the threshold networks corresponds to a different weak decision voltage range from a plurality of weak decision voltage ranges, and a selection component configured to select a threshold network from the plurality of threshold networks based on the detected voltage information.

An apparatus, system, and method for flash memory de-noising using machine learning models are described. Embodiments of the apparatus, system, and method are configured to a memory device comprising a plurality of memory cells arranged in a plurality of wordlines and a plurality of bitlines and a memory controller comprising a processor, wherein the memory controller is configured to receive read information for a memory cell of a memory device; select a threshold network from a plurality of threshold networks based on the read information, wherein each of the threshold networks corresponds to a different weak decision voltage range from a plurality of weak decision voltage ranges; generate an estimation of a channel output from the read information using the selected threshold network.

BRIEF DESCRIPTION OF THE DRAWINGS

Features of the present inventive concept will become more apparent by describing in detail embodiments thereof with reference to the accompanying drawings.

DETAILED DESCRIPTION

Figure 1:
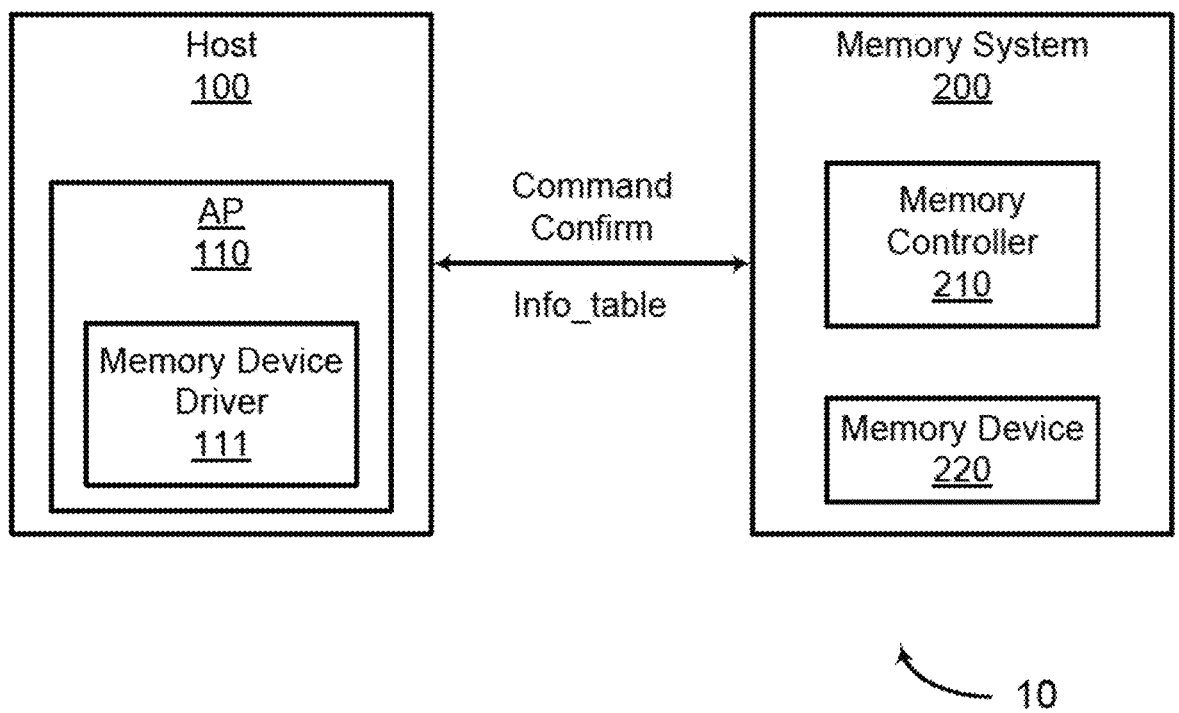
FIG. 1 is a block diagram illustrating an implementation of a data processing system including a memory system, according to an embodiment of the inventive concept.

The present disclosure relates to system and methods for reading data from a memory device, and more specifically to de-noising data read from a memory device. Certain embodiments of the disclosure specifically relate to de-noising NAND cell read information using an equalizer with multiple threshold-expert machine learning models.

Memory devices are commonly used electronic components for storing data. NAND flash memory devices allow several bits of data to be stored in each memory cell, providing improvements in manufacturing costs and performance. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels.

To read the information from a memory device, voltage of each cell is measured and the voltage level that was stored in the cell is inferred. The bits can then be recovered. There may be a tradeoff between the number of voltage levels and the memory reliability. The larger the number of bits per cell, the more information that can be stored on the device, where there are more bits in every cell. Alternatively, the voltages that represent different levels may be packed more tightly together, because within the same dynamic range, a larger number of distinguishable voltages is used. As a result, noise in the cell programming or cell reading has a larger chance of changing the voltage of a level to another voltage representing a different level, therefore rendering an error upon reading the cell. In other words, when information is read from a cell (e.g., a NAND cell), the read information may be corrupted with noise (e.g., depending on the characteristics of the medium), which may result in an ambiguous value of the read information (e.g., the read voltage level may be within some weak decision voltage range between two voltage values where voltage information for different values of the detected channel output are likely to overlap). In some examples, such may cause error correction code (ECC) operations to fail.

Conventional approaches for handling ECC operation failures may include utilization of an equalizer module in effort to reduce inter-symbol-interference (ISI) across the NAND cells. Such equalization modules may receive sample (memory cell) features (e.g., cell voltage, pillar and wordline neighbors, thresholds, etc.) as input, and equalization modules may output improved soft symbols estimations (e.g., that may be used for more efficient ECC operations on the improved soft symbol estimations). However, equalization modules may pass samples through a same model (e.g., such as a neural network) for soft symbol estimations across different voltage levels. Such approaches may demand relatively sophisticated (e.g., deep, computationally intensive, etc.) machine-learning models with high latency and memory requirements, which may not provide optimal performance. Further, due to high latency/memory requirements, only limited NAND architectures may be able to support such equalization modules.

Systems and methods of the present disclosure may be used to improve equalization module architectures for NAND cell read information. For example, embodiments of the present disclosure may provide for de-noising of NAND cell read information using a Multiple Shallow Threshold-Expert Machine Learning Models (MTM) equalizer. An MTM equalizer may include multiple shallow machine learning models, where each machine learning model is trained to specifically solve a classification task (e.g., a binary classification task) corresponding to a weak decision range between two possible read information values for a given NAND cell read operation. Accordingly, during inference, each read sample with a read value within a weak decision range is passed through a corresponding shallow machine learning model (e.g., a corresponding threshold expert) that is associated with (e.g., trained for) the particular weak decision range.

The plurality of threshold-expert shallow machine learning models may thus output improved soft symbols estimation for their respective weak decision ranges (e.g., due to training of each threshold-expert to handle classification tasks associated with specific weak decision ranges). The improved soft symbols estimations may be used to generate improved codewords for subsequent ECC operations (e.g., which may improve EEC operation efficiency). Utilization of multiple shallow machine learning models, each trained to solve a specific binary classification task associated with different weak decision ranges, may also result in a set of machine learning models that can be operated with low memory usage (e.g., less memory usage than ECC) and low latency. Further, such equalization models can be implemented in firmware, such that the equalizer models can be used by various NAND flash memory architectures.

Embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment. It should be understood that descriptions of features or aspects within each exemplary embodiment should typically be considered as available for other similar features or aspects in other exemplary embodiments, unless the context clearly indicates otherwise. As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Example Memory Device

FIGS. 1-5 show an example memory system according to aspects of the present disclosure. In memory systems (e.g., such as SSD systems), memory controllers are connected to several NAND channels in parallel to achieve high data throughput. Memory controllers include signal processing and ECC engines that decode the data from the NAND and retrieve the stored data reliably. As described herein, the example memory system of FIGS. 1-5 may include a memory controller with a plurality of NAND de-noising threshold experts (e.g., a memory controller with an equalizer including multiple shallow threshold-expert machine learning models).

FIG. 1 is a block diagram illustrating an implementation of a data processing system including a memory system, according to an embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, embodiments of the inventive concept will be described as including a memory device that is a non-volatile memory. However, embodiments are not limited thereto. For example, the memory system 200 may include a memory device that is a volatile memory.

According to embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

A processor is an intelligent hardware device, (e.g., a general-purpose processing component, a digital signal processor (DSP), a CPU, a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the processor is configured to operate a memory array using a memory controller. In other cases, a memory controller is integrated into the processor. In some cases, the processor is configured to execute computer-readable instructions stored in a memory to perform various functions. In some embodiments, a processor includes special purpose components for modem processing, baseband processing, digital signal processing, or transmission processing.

As described above, the host 100 may include an AP 110. The AP 110 may include various intellectual property (IP) blocks. For example, the AP 110 may include a memory device driver 111 that controls the memory system 200. The host 100 may communicate with the memory system 200 to transmit a command related to a memory operation and receive a confirm command in response to the transmitted command. The host 100 may also communicate with the memory system 200 with regard to an information table related to the memory operation.

The memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command. In some examples, a memory device 220 may be referred to as a channel. The term channel is used because a write and/or send operation can go to and/or through the channel. In some cases, when the information is read, the information may be corrupted with noise, depending on the characteristics of the medium.

As described herein, a memory controller 210 may include multiple threshold experts (e.g., a memory controller 210 may de-noise memory device 220 (e.g., NAND) read information using an equalizer including multiple shallow threshold-expert machine learning models). For instance, memory controller 210 may include a MTM equalizer that includes a plurality of threshold networks, where each threshold network is trained to specifically solve a NAND read value classification task. Memory controller 210 is an example of, or includes aspects of, the corresponding element described herein (e.g., with reference to FIG. 8).

Figure 4:
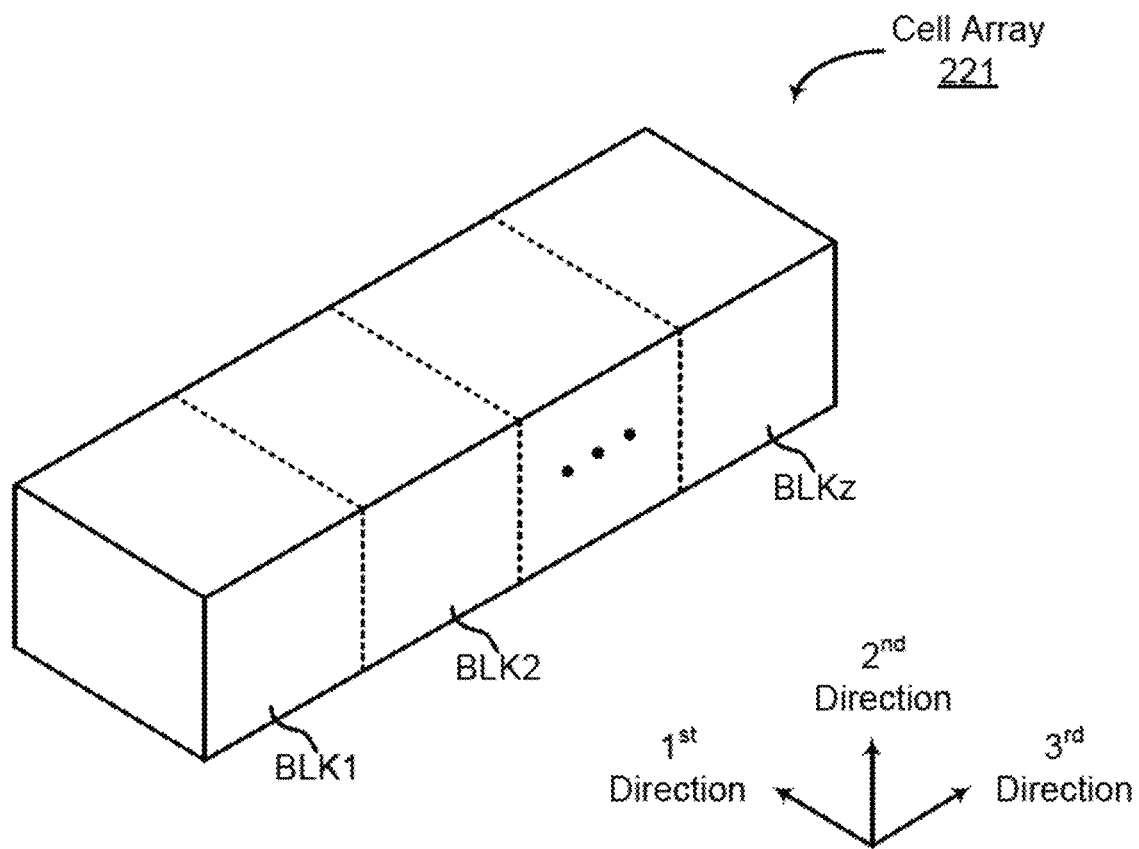
FIG. 4 is a block diagram of the memory cell array of FIG. 2, according to an embodiment of the inventive concept.

The memory device 220 includes a memory cell array that retains data stored therein, even when the memory device 220 is not powered on. The memory cell array may include as memory cells, for example, a NAND or NOR flash memory, a magneto-resistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
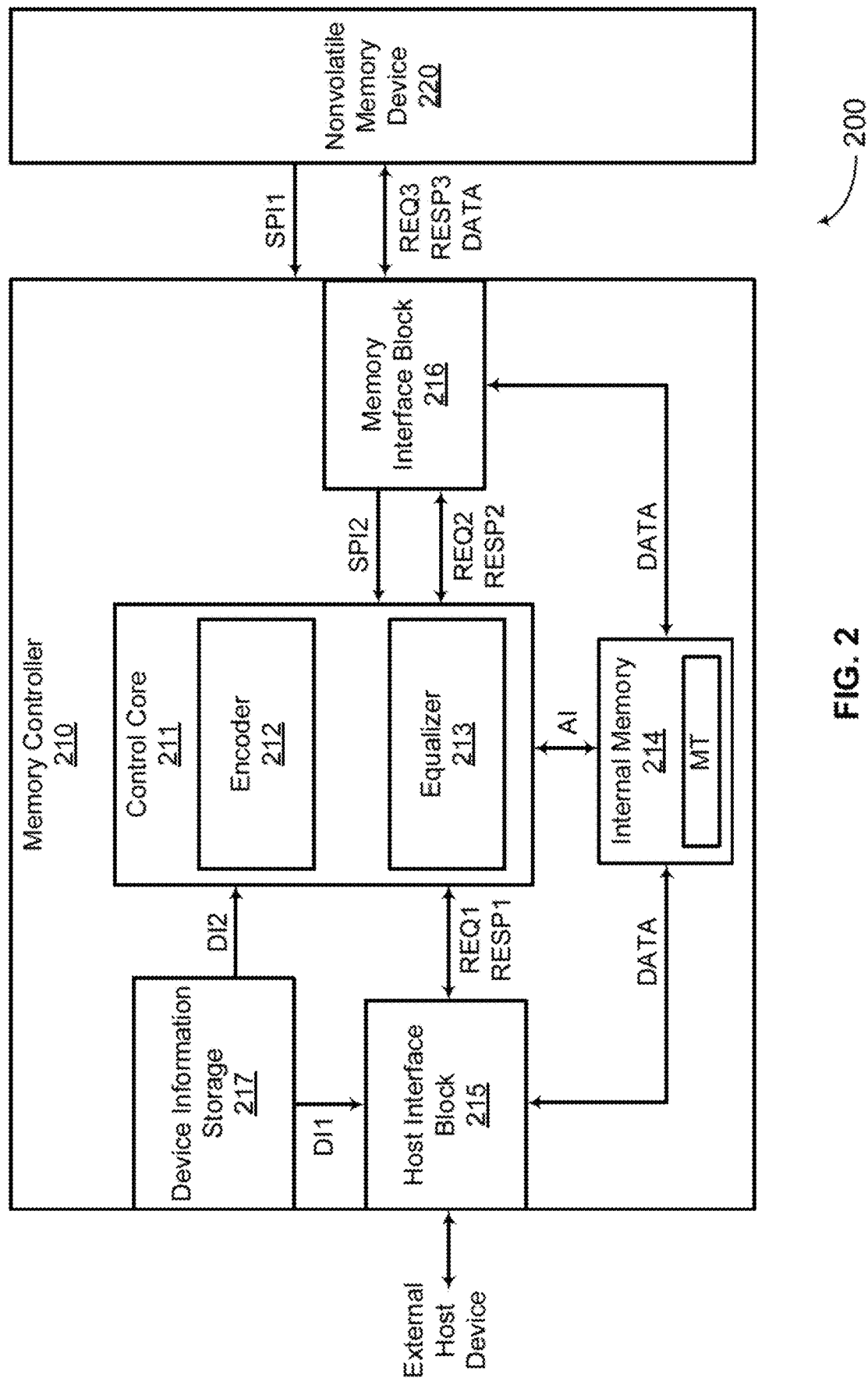
FIG. 2 is a block diagram illustrating the memory system of FIG. 1, according to an embodiment of the inventive concept.

FIG. 2 is a block diagram illustrating the memory system 200 of FIG. 1, according to an embodiment of the inventive concept.

Referring to FIG. 2, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 211, an internal memory 214, a host interface block 215, and a memory interface block 216. The memory controller 210 may also include a device information storage 217 configured provide first device information DI1 to the host interface block 215 and second device information DI2 to the controller core 211.

In some embodiments, controller core 211 may include encoder 212 and equalizer 213. In some embodiments, equalizer 213 may be an example of, may include aspects of, or may implement neural network 600, plurality of threshold experts 810, plurality of threshold experts 905, and plurality of threshold experts 1020. As described herein, encoder 212 may perform an ECC operation on read information (e.g., cell voltage, same-pillar neighbor voltage, etc.). In cases where an ECC operation fails, the read information may be passed to equalizer 213, or new read information may be read from memory device 220 by the equalizer 213.

In accordance with the techniques described herein, the equalizer 213 may, using a plurality of shallow threshold-expert machine learning networks, generate an improved memory channel output from the read information using a threshold network selected for the read information (e.g., a threshold network trained for a classification operation in a weak decision range corresponding to the read information). That is, an initial memory channel output may be generated, and if an ECC operation fails, the equalizer 213 may generated an improved memory channel output that represents a better estimation of the originally stored information in one or more memory cells. Accordingly, the controller core 211 may generate an updated codeword and perform a successful ECC operation based on the estimated channel output (e.g., based on soft symbol estimations from the one or more threshold networks of the equalizer 213).

The controller core 211 may include a memory control core that may control and access the memory device 220 depending on a request received from the host 100 or an internally designated schedule. The memory control core may manage and execute various metadata and codes used to manage or operate the memory system 200. In some embodiments, the controller core 211 may include a memory control core and a machine learning core, and each of these cores may be implemented by one or more processors. In some examples where memory controller 210 includes a machine learning core, the machine learning core may be used to perform training and inference of threshold-expert networks (e.g., shallow threshold-expert machine learning networks) described with reference to FIGS. 6 and 8-10. For instance, such threshold-expert networks may be designed and trained to perform equalization or de-noising operations on read information read from memory device 220.

The internal memory 214 may be used, for example, as a system memory which is used by the controller core 211, a cache memory which stores data of the memory device 220, or a buffer memory which temporarily stores data between the host 100 and the memory device 220. The internal memory 214 may store a mapping table MT that indicates a relationship between logical addresses assigned to the memory system 200 and physical addresses of the memory device 220. The internal memory 214 may include, for example, a DRAM or an SRAM.

The host interface block 215 may include a component for communicating with the host 100 such as, for example, a physical block. The memory interface block 216 may include a component for communicating with the memory device 220 such as, for example, a physical block.

Below, an operation of the memory system 200 over time will be described. When power is supplied to the memory system 200, the memory system 200 may perform initialization with the host 100.

The host interface block 215 may provide the memory control core with a first request REQ1 received from the host 100. The first request REQ1 may include a command (e.g., a read command or a write command) and a logical address. The memory control core may translate the first request REQ1 to a second request REQ2 suitable for the memory device 220.

For example, the memory control core may translate a format of the command. The memory control core may obtain address information AI with reference to the mapping table MT stored in the internal memory 214. The memory control core may translate a logical address to a physical address of the memory device 220 by using the address information AI. The memory control core may provide the second request REQ2 suitable for the memory device 220 to the memory interface block 216.

The memory interface block 216 may register the second request REQ2 from the memory control core at a queue. The memory interface block 216 may transmit a request that is first registered at the queue to the memory device 220 as a third request REQ3.

When the first request REQ1 is a write request, the host interface block 215 may write data received from the host 100 to the internal memory 214. When the third request REQ3 is a write request, the memory interface block 216 may transmit data stored in the internal memory 214 to the memory device 220.

When data is completely written, the memory device 220 may transmit a third response RESP3 to the memory interface block 216. In response to the third response RESP3, the memory interface block 216 may provide the memory control core with a second response RESP2 indicating that the data is completely written.

After the data is stored in the internal memory 214 or after the second response RESP2 is received, the memory control core may transmit a first response RESP1 indicating that the request is completed to the host 100 through the host interface block 215.

When the first request REQ1 is a read request, the read request may be transmitted to the memory device 220 through the second request REQ2 and the third request REQ3. The memory interface block 216 may store data received from the memory device 220 in the internal memory 214. When data is completely transmitted, the memory device 220 may transmit the third response RESP3 to the memory interface block 216.

As the third response RESP3 is received, the memory interface block 216 may provide the memory control core with the second response RESP2 indicating that the data is completely stored. As the second response RESP2 is received, the memory control core may transmit the first response RESP1 to the host 100 through the host interface block 215.

The host interface block 215 may transmit data stored in the internal memory 214 to the host 100. In an embodiment, in the case in which data corresponding to the first request REQ1 is stored in the internal memory 214, the transmission of the second request REQ2 and the third request REQ3 may be omitted.

The memory device 220 may also transmit first Serial Peripheral Interface information SPI1 to the memory interface block 216. The memory interface block 216 may transmit second Serial Peripheral Interface information SPI2 to the controller core 211.

Figure 3:
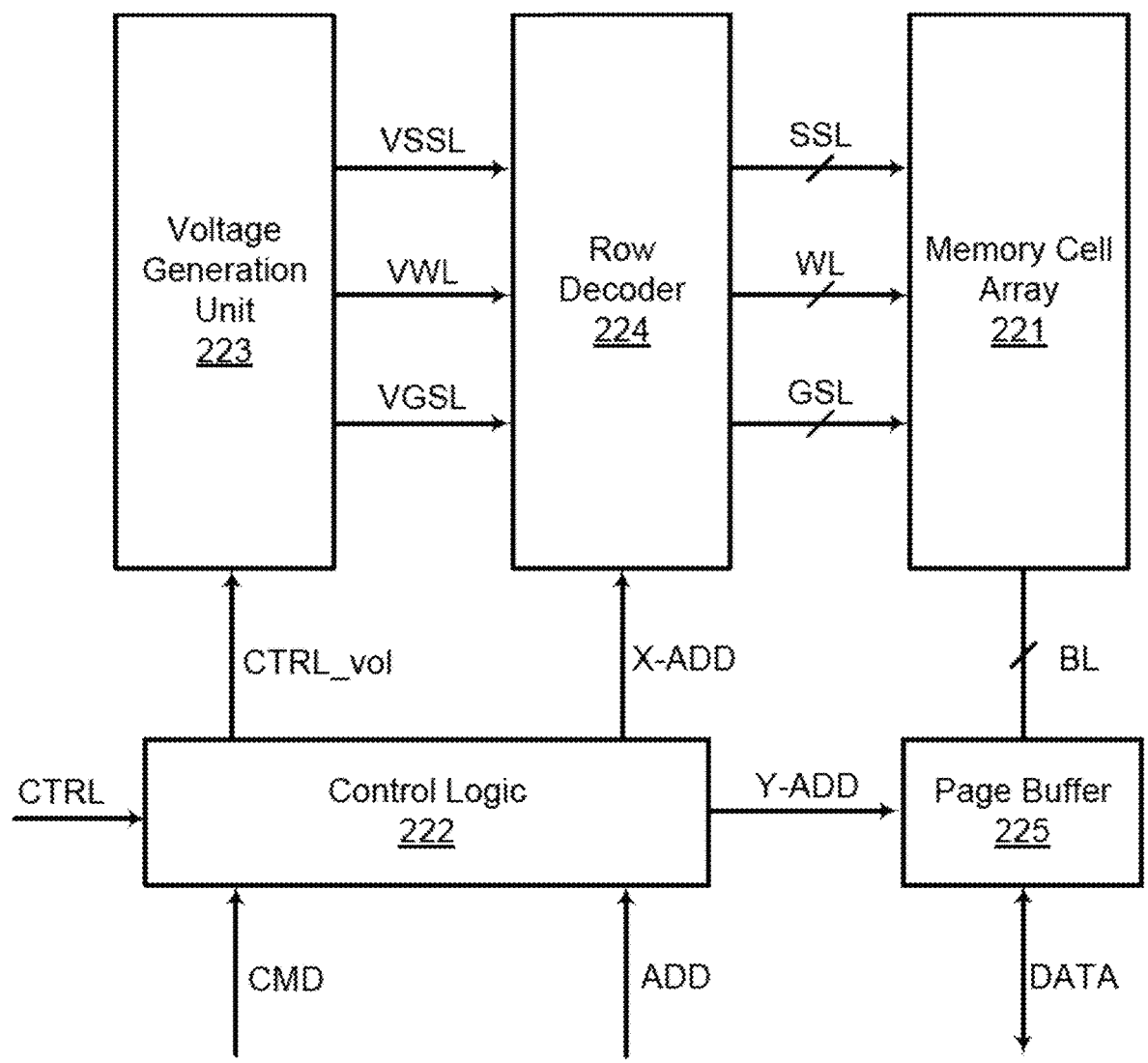
FIG. 3 is a detailed block diagram of a non-volatile memory device of FIG. 1, according to an embodiment of the inventive concept.

FIG. 3 is a detailed block diagram of the non-volatile memory device 220 of FIG. 1, according to an embodiment of the inventive concept. Referring to FIG. 3, the memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 5:
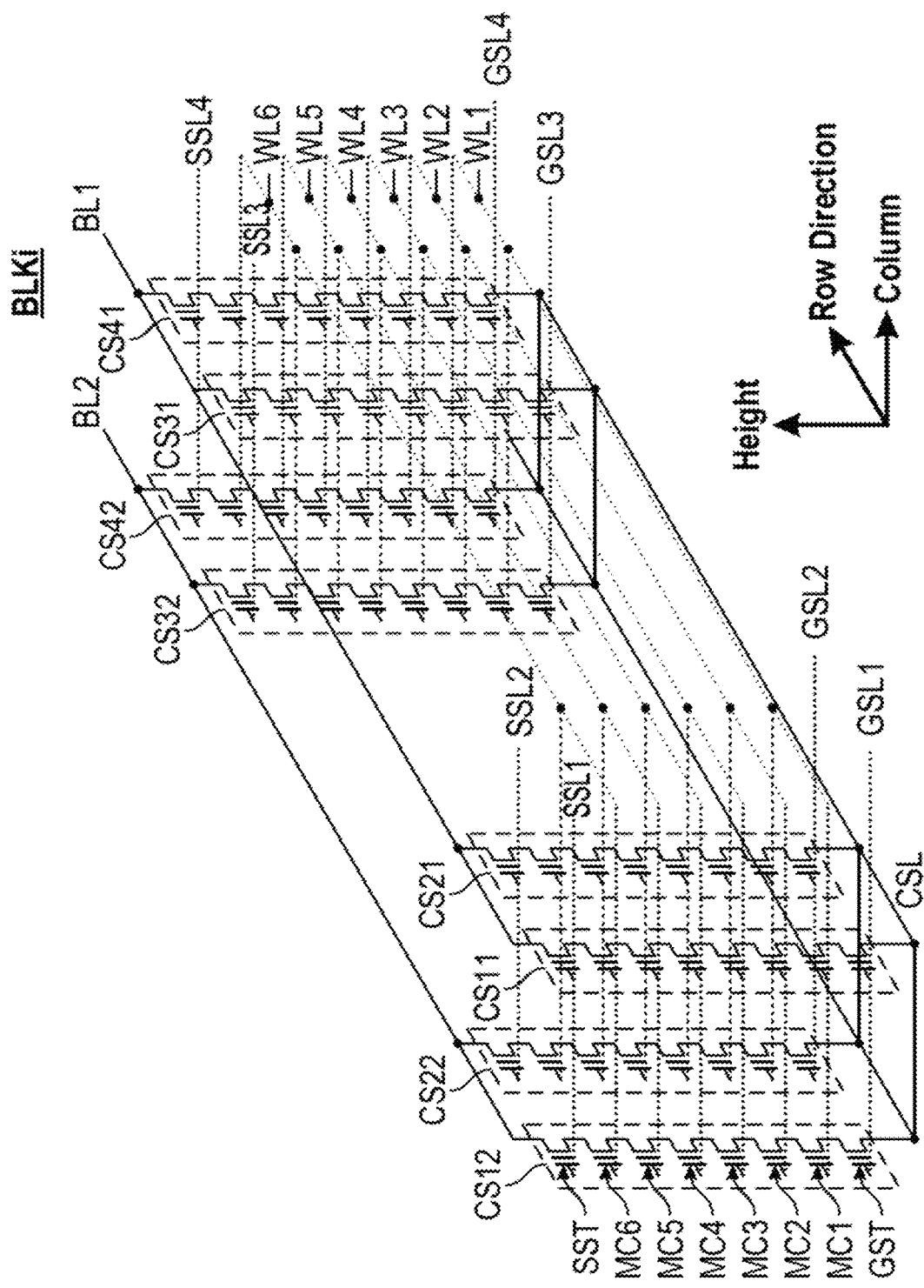
FIG. 5 is a circuit diagram of a memory block of the memory cell array of FIG. 4, according to an embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an embodiment of the inventive concept.

Referring to FIG. 4, the memory cell array 221 according to an embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an embodiment of the inventive concept. FIG. 5 illustrates an example of one of the memory blocks BLK1 to BLKz in the memory cell array 221 of FIG. 4. Although FIG. 5 illustrates an examples with 6 word lines and memory cells, this is just an illustration and any number of word lines and memory cells may be used.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

De-Noising

Figure 6:
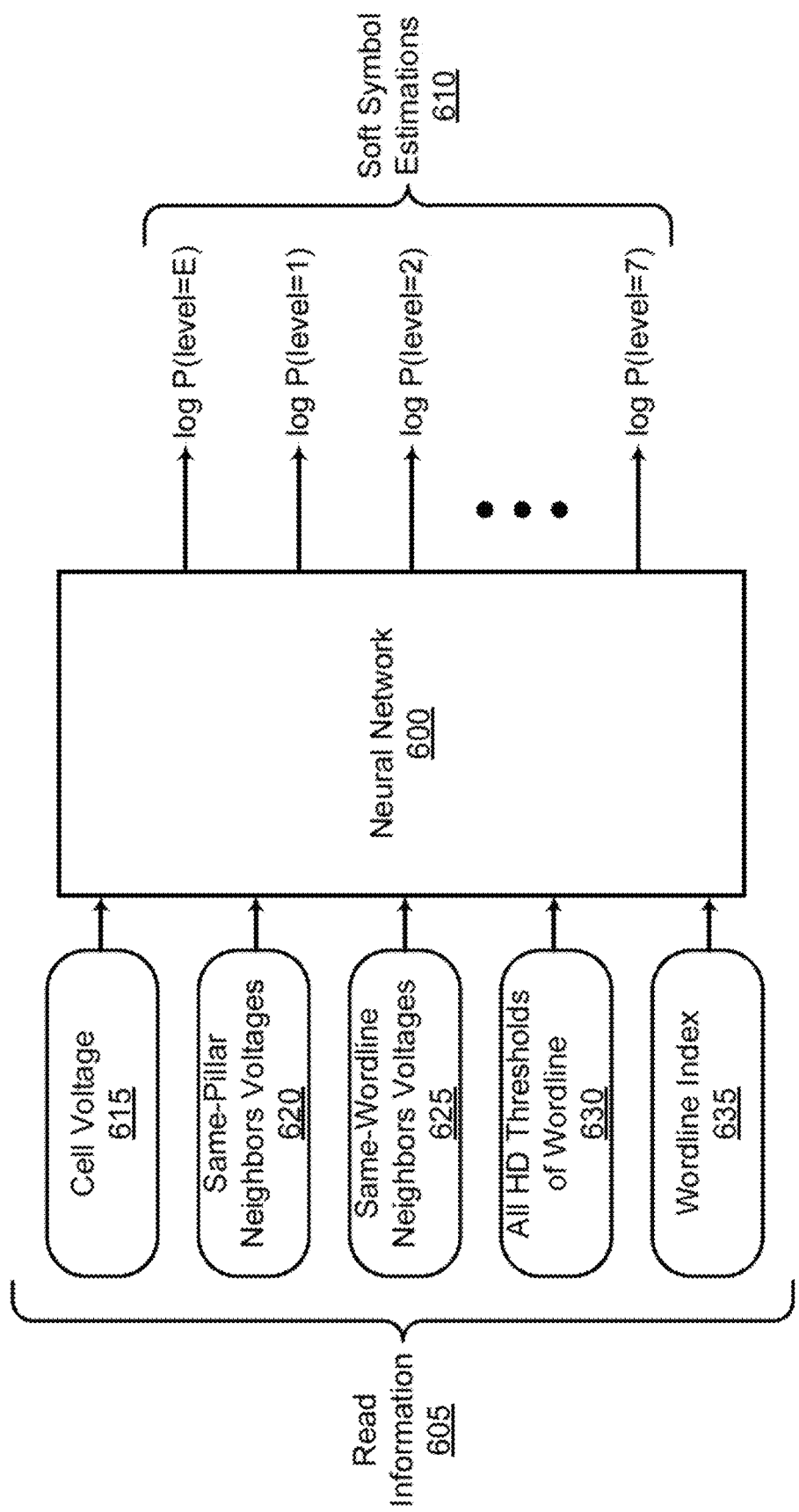
FIG. 6 shows an example of an example equalizer architecture according to aspects of the present disclosure.

FIG. 6 shows an example of an example equalizer architecture according to aspects of the present disclosure. The example shown includes neural network 600, read information 605, and symbol estimations 610. Neural network 600 may be included in, or implemented via, equalizer 213 as described with reference to FIG. 2. Read information 605 is an example of, or includes aspects of, the corresponding element described with reference to FIG. 9. Symbol estimations 610 is an example of, or includes aspects of, the corresponding element described with reference to FIG. 9.

A neural network 600 is a type of computer algorithm that is capable of learning specific patterns without being explicitly programmed, but through iterations over known data. A neural network 600 may refer to a cognitive model that includes input nodes, hidden nodes, and output nodes. Nodes in the network may have an activation function that computes whether the node is activated based on the output of previous nodes. Training the system may involve supplying values for the inputs, and modifying edge weights and activation functions (algorithmically or randomly) until the result closely approximates a set of desired outputs.

An artificial neural network 600 is a hardware or a software component that includes a number of connected nodes (i.e., artificial neurons), which loosely correspond to the neurons in a human brain. Each connection, or edge, transmits a signal from one node to another (like the physical synapses in a brain). When a node receives a signal, it processes the signal and then transmit the processed signal to other connected nodes. In some cases, the signals between nodes comprise real numbers, and the output of each node is computed by a function of the sum of its inputs. Each node and edge is associated with one or more node weights that determine how the signal is processed and transmitted. During the training process, these weights are adjusted to improve the accuracy of the result (i.e., by minimizing a loss function which corresponds in some way to the difference between the current result and the target result). The weight of an edge increases or decreases the strength of the signal transmitted between nodes. In some cases, nodes have a threshold below which a signal is not transmitted at all. In some examples, the nodes are aggregated into layers. Different layers perform different transformations on their inputs. The initial layer is known as the input layer and the last layer is known as the output layer. In some cases, signals traverse certain layers multiple times.

In the example of FIG. 6, an equalizer architecture includes a neural network 600 that outputs soft symbol estimations 610 based on input read information 605. Read information 605 may include cell voltage information 615, same-pillar neighbors voltage information 620, same-wordline neighbors voltage information 625, HD thresholds (e.g., all HD thresholds) of a wordline information 630, and wordline index information 635, among other examples. In the example of FIG. 6, all samples (e.g., all read information 605) may be passed through the neural network 600 (e.g., and the neural network 600 outputs soft symbol estimations 610 for all read information 605).

As described herein, an equalizer (e.g., an equalizer module) is used to minimize the inter-symbol-interference (ISI) across NAND cells. The equalization module receives sample (memory cell) features. For example, sample features may include cell voltage, pillar, and wordline neighbors, thresholds, etc. Some equalization modules assume all samples pass through the same neural network (e.g., such as neural network 600). In other words, neural network 600 may analyze all samples and perform complex classification operations to classify the various samples into a voltage state out of several possible voltage states. The same features are fed to a neural network 600 (e.g., producing 16 total probabilities that are associated with each level). For example, the equalizer architecture shown in the example of FIG. 6 can be used for 3 bits per cell (e.g., triple-level cell (TLC)) flash memory.

In some examples, neural networks such as neural network 600 may include complex machine-learning models (e.g., that may be associated with high latency and memory parameters for complex classification operations). Due to high latency and memory parameters, specific NAND architectures are used to support the equalization modules. Some NAND architectures may not be able to support some equalization modules (e.g., due to the complexity of some neural network architectures used classify various samples into one voltage state out of several possible voltage states).

De-Noising Using MTM

Figure 7:
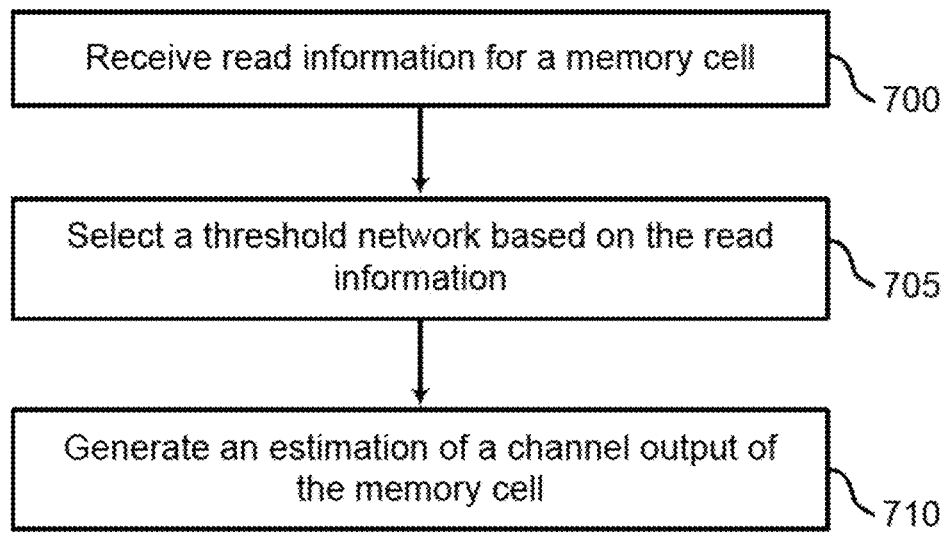
FIG. 7 shows an example of a process for flash memory de-noising using machine learning models according to aspects of the present disclosure.

FIG. 7 shows an example of a process for flash memory de-noising using machine learning models according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

At operation 700, the system receives read information for a memory cell of a memory device. In some cases, the operations of this step refer to, or may be performed by, a voltage detector as described with reference to FIG. 8.

At operation 705, the system selects a threshold network from a set of threshold networks based on the read information, where each of the threshold networks corresponds to at least one weak decision voltage range from a set of weak decision voltage ranges of the memory cell. In some cases, the operations of this step refer to, or may be performed by, a selection component as described with reference to FIGS. 8 and 9.

At operation 710, the system generates an improved memory channel output from the read information using the selected threshold network. In some cases, the operations of this step refer to, or may be performed by, a plurality of threshold networks as described with reference to FIGS. 8-10.

Figure 8:
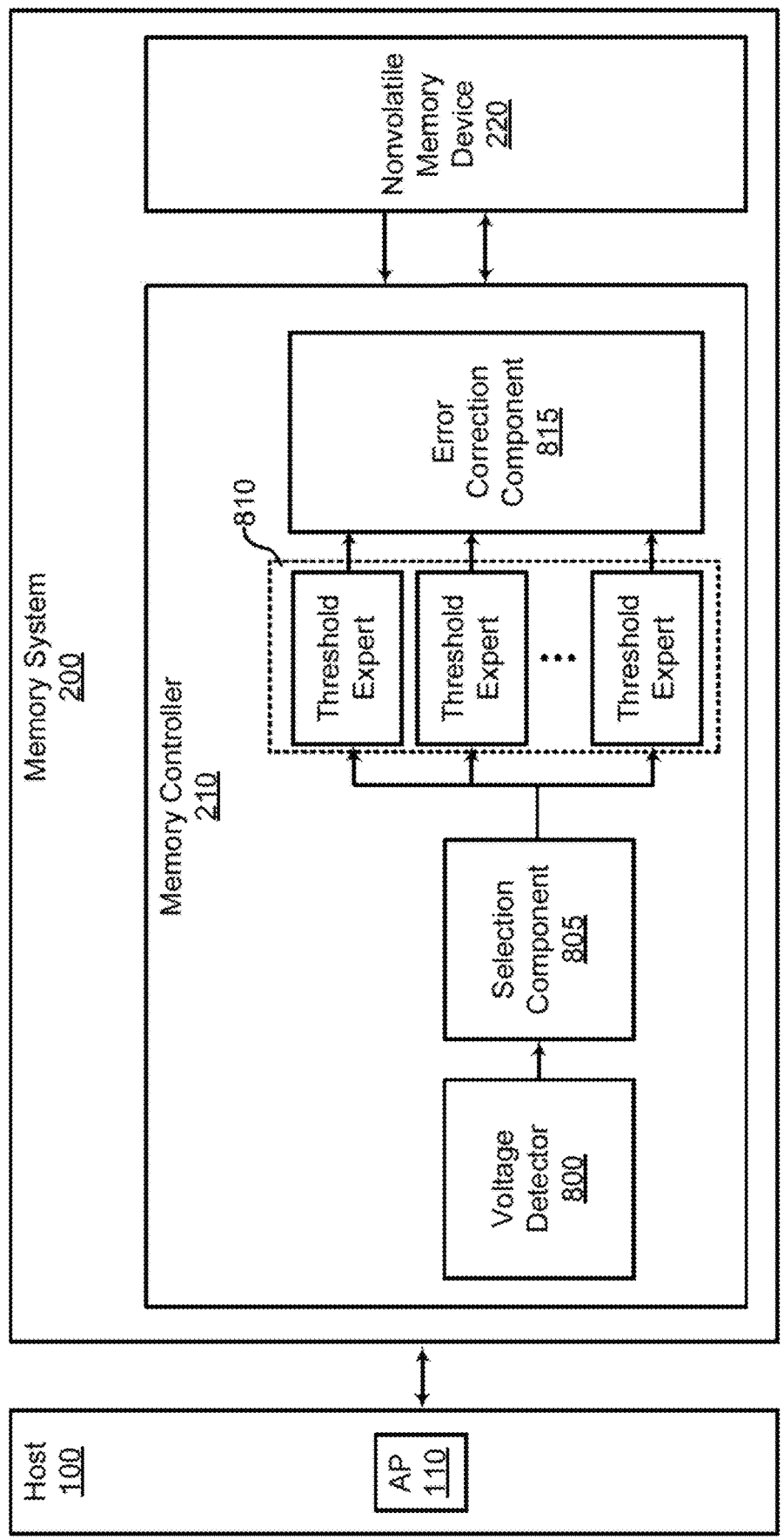
FIG. 8 shows an example of a block diagram illustrating an implementation of a data processing system including a memory system according to aspects of the present disclosure.

FIG. 8 shows an example of a block diagram illustrating an implementation of a data processing system including a memory system according to aspects of the present disclosure. The example shown includes voltage detector 800, selection component 805, plurality of threshold networks 810, error correction component 815, host device 100, memory device 220, and memory controller 210. Host device 100, memory device 220, and memory controller 210 are examples of, or include aspects of, the corresponding elements described with reference to FIGS. 1 and 2. Plurality of threshold networks 810 may be included in, or implemented via, equalizer 213 as described with reference to FIG. 2.

Examples of a memory system 200 include random access memory (RAM), read-only memory (ROM), or a hard disk. Examples of memory systems 200 include solid state memory and a hard disk drive. In some examples, memory is used to store computer-readable, computer-executable software including instructions that, when executed, cause a processor to perform various functions described herein. In some cases, the memory contains, among other things, a basic input/output system (BIOS) which controls basic hardware or software operation such as the interaction with peripheral components or devices. In some cases, a memory controller 210 operates memory cells. For example, the memory controller 210 can include a row decoder, column decoder, or both. In some cases, memory cells within a memory store information in the form of a logical state.

In some embodiments, examples of the memory system 200 include flash memory. Flash memory is an electronic (solid-state) non-volatile computer storage medium that can be electrically erased and reprogrammed. The two main types of flash memory are named after the NAND and NOR logic gates. The individual flash memory cells exhibit internal characteristics similar to those of the corresponding gates. Where EPROMs had to be completely erased before being rewritten, NAND-type flash memory may be written and read in blocks (or pages) which are generally much smaller than the entire device. NOR-type flash allows a single machine word (byte) to be written—to an erased location—or read independently. The NAND type operates primarily in memory cards, USB flash drives, solid-state drives (those produced in 2009 or later), and similar products, for general storage and transfer of data. NAND or NOR flash memory is also often used to store configuration data in numerous digital products, a task previously made possible by EEPROM or battery-powered static RAM. One key disadvantage of flash memory is that it can only endure a relatively small number of write cycles in a specific block. Example applications of both types of flash memory include personal computers, PDAs, digital audio players, digital cameras, mobile phones, synthesizers, video games, scientific instrumentation, industrial robotics, and medical electronics.

In addition to being non-volatile, flash memory offers fast read access times, although not as fast as static RAM or ROM. Its mechanical shock resistance helps explain its popularity over hard disks in portable devices, as does its high durability, ability to withstand high pressure, temperature and immersion in water, etc. Although flash memory is technically a type of EEPROM, the term "EEPROM" is generally used to refer specifically to non-flash EEPROM which is erasable in small blocks, typically bytes. Because erase cycles are slow, the large block sizes used in flash memory erasing give it a significant speed advantage over non-flash EEPROM when writing large amounts of data. Flash memory costs much less than byte-programmable EEPROM and had become the dominant memory type wherever a system required a significant amount of non-volatile solid-state storage.

Flash memory stores information in an array of memory cells made from floating-gate transistors. In single-level cell (SLC) devices, each cell stores only one bit of information. In multi-level cell (MLC) devices, including TLC devices, can store more than one bit per cell. The floating gate may be conductive or non-conductive. In NOR flash, each cell has one end connected directly to ground, and the other end connected directly to a bit line. This arrangement is called "NOR flash" because it acts like a NOR gate: when one of the word lines is brought high, the corresponding storage transistor acts to pull the output bit line low. NAND flash also uses floating-gate transistors, but they are connected in a way that resembles a NAND gate: several transistors are connected in series, and the bit line is pulled low only if all the word lines are pulled high. These groups are then connected via some additional transistors to a NOR-style bit line array in the same way that single transistors are linked in NOR flash. Compared to NOR flash, replacing single transistors with serial-linked groups adds an extra level of addressing.

In the example of FIG. 8, an equalizer architecture of memory controller 210 includes a plurality of threshold networks 810 that each output soft symbol estimations (e.g., generated estimations of channel output of a memory cell) to error correction component 815 based on input read information from memory device 220 (e.g., for error correction component 815 to perform an ECC operation on the output soft symbol estimations). For instance, a voltage detector 800 may detect read information (e.g., voltage information) from a memory cell, and selection component 805 may select a threshold network from the plurality of threshold networks 810 to perform a classification operation on the read information. In the example of FIG. 7, samples (e.g., read information samples, detected voltage information samples, etc.) may be passed through a specific threshold network, from the plurality of threshold networks 810, where the specific threshold network for each sample is selected by selection component 805 based on the sample (e.g., based on a weak decision range the sample resides in, as further described herein, for example, with reference to FIG. 10).

Accordingly, each threshold expert of the plurality of threshold experts 810 may include a shallow machine learning model (e.g., a shallow threshold-expert machine learning model) that may be associated with low latency and low memory parameters. That is, the shallow threshold networks described herein may perform binary classification operations for a particular weak decision range (e.g., as described in more detail herein, for example, with reference to FIGS. 9 and 10). Such classification operations may be less complex relative to classification operations for several possible voltage states (e.g., as performed by more complex machine learning models such as, for example, neural network 600). Accordingly, due to reduced latency and memory parameters, various NAND architectures may support such equalization architectures implementing a plurality of threshold networks 810 (e.g., a plurality of shallow threshold-expert machine learning models each performing a respective classification operation between two corresponding voltage states).

According to some embodiments, host device 100 may be configured to transmit a read command to the memory device 220 (e.g., where read information is read by the memory controller 210 based on, or in response to, the read command). According to some embodiments, host device 100 may be configured to receive a response from the memory controller 210 based at least in part on estimated channel output.

According to some embodiments, voltage detector 800 receives read information for a memory cell of a memory device 220. In some examples, the read information includes one or more of a voltage information of the memory cell, a voltage information of a cell in a neighboring wordline of the memory cell, a voltage of a cell in a same wordline as the memory cell, one or more HD thresholds of a wordline, one or more SD thresholds of a wordline, and a wordline index. In some examples, voltage detector 800 receives second read information for a second memory cell of the memory device 220. According to some embodiments, voltage detector 800 may be configured to detect voltage information from a memory cell.

According to some embodiments, selection component 805 selects a threshold network from a set of threshold networks based on the read information, where each of the threshold networks corresponds to at least one weak decision voltage range from a set of weak decision voltage ranges of the memory cell. In some examples, a number of the threshold networks is one less than a number of hard decision thresholds. In some examples, selection component 805 determines that the read information corresponds to a weak decision voltage range from the set of weak decision voltage ranges, where the threshold network is selected based on the determination. In some examples, selection component 805 transmits the read information to the selected threshold network. In some examples, each of the weak decision voltage ranges includes a region between two hard decision thresholds where voltage information for different values of the detected channel output are likely to overlap. In some examples, the weak decision voltage ranges are separated from each other by a set of strong decision voltage ranges, and where each of the strong decision voltage ranges corresponds to a value of the channel output. In some examples, selection component 805 determines that the second read information corresponds to a second weak decision voltage range from the set of weak decision voltage ranges, where the second weak decision voltage range is different from the weak decision voltage range. In some examples, selection component 805 determines that a second threshold network corresponds to the second weak decision voltage range. In some examples, selection component 805 selects the second threshold network from the set of threshold networks, where the second threshold network is different from the threshold network.

According to some embodiments, selection component 805 may be configured to select a threshold network from the plurality of threshold networks 810 based on the detected voltage information. In some examples, the selection component 805 is further configured to determine that the detected voltage information corresponds to a weak decision voltage range from the set of weak decision voltage ranges, where the threshold network is selected based on the determination. Selection component 805 is an example of, or includes aspects of, the corresponding element described with reference to FIG. 9.

The plurality of threshold networks 810 is an example of, or includes aspects of, the corresponding element described with reference to FIGS. 9 and 10. According to some embodiments, plurality of threshold networks 810 generates an improved memory channel output from the read information using the selected threshold network. In some examples, each of the threshold networks is trained to operate using read information corresponding to a specific weak decision voltage range. In some examples, plurality of threshold networks 810 generates LLRs based on the improved memory channel output.

According to some embodiments, plurality of threshold networks 810 may be configured to estimate a channel output of the memory cell based on the detected voltage information, wherein each of the threshold networks corresponds to a different weak decision voltage range from a plurality of weak decision voltage ranges. In some examples, the each of the set of threshold networks is further configured to generate an output value that indicates whether the detected voltage information corresponds to a first value of the channel output or a second value of the channel output. In some examples, each of the threshold networks is trained to operate on read information corresponding to a specific weak decision voltage range. In some examples, each of the weak decision voltage ranges includes a region surrounding a hard decision threshold where voltage information for different values of the channel output are likely to overlap.

According to some embodiments, error correction component 815 performs an ECC operation. According to some embodiments, error correction component 815 may be configured to perform an ECC operation on a codeword based on the improved memory channel output.

According to some embodiments, memory device 220 comprises a plurality of memory cells arranged in a plurality of wordlines and a plurality of bitlines. According to some embodiments, memory controller 210 reads a set of memory cells including the memory cell. In some examples, memory controller 210 generates a codeword based on the reading. In some examples, memory controller 210 determines that the ECC operation failed. In some examples, memory controller 210 generates an updated codeword based on the improved memory channel output. In some examples, memory controller 210 receives a read command from a host device 100. In some examples, memory controller 210 reads voltage information from the memory cell in response to the read command, where the read information includes the voltage information. In some examples, memory controller 210 transmits a response to the host device 100 based on the codeword.

In some examples, memory controller 210 comprises a processor. According to some embodiments, the memory controller 210 is configured to receive read information for a memory cell of a memory device 220. According to some embodiments, the memory controller 210 is configured to select a threshold network (e.g., a threshold expert) from a plurality of threshold networks 810 based on the read information, where each of the threshold networks 810 corresponds to a different weak decision voltage range from a plurality of weak decision voltage ranges (e.g., as further described herein, for example, with reference to FIG. 10). According to some embodiments, the memory controller 210 is configured to generate an estimation of a channel output from the read information using the selected threshold network 810. As described herein, in some examples, host device 100 may be configured to receive a response from the memory controller 210 based at least in part on the estimate of the channel output.

Figure 9:
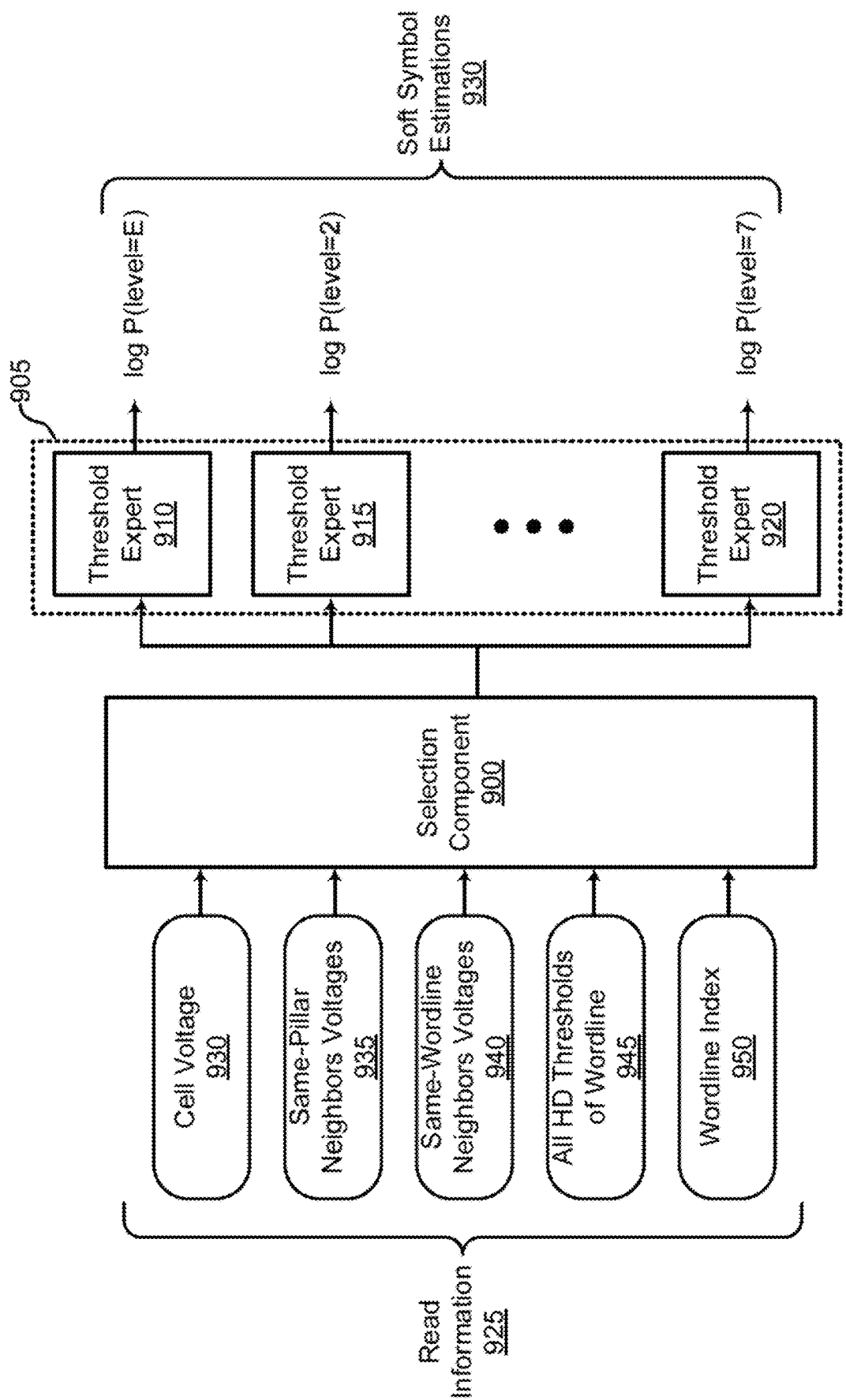
FIG. 9 shows an example of an example equalizer architecture using multiple threshold-expert machine learning models according to aspects of the present disclosure.

FIG. 9 shows an example of an example equalizer architecture using multiple threshold-expert machine learning models according to aspects of the present disclosure. The example shown includes selection component 900, plurality of threshold networks 905, read information 925, and symbol estimations 930. Plurality of threshold networks 905 may be included in, or implemented via, equalizer 213 as described with reference to FIG. 2.

Selection component 900 is an example of, or includes aspects of, the corresponding element described with reference to FIG. 8. Plurality of threshold networks 905 is an example of, or includes aspects of, the corresponding element described with reference to FIGS. 8 and 10. In one embodiment, plurality of threshold networks 905 includes first threshold expert 910, second threshold expert 915, and third threshold expert 920. First threshold expert 910, second threshold expert 915, and third threshold expert 920 are examples of, or include aspects of, the corresponding elements described with reference to FIG. 10. Read information 925 is an example of, or includes aspects of, the corresponding element described with reference to FIG. 6. Symbol estimations 930 is an example of, or includes aspects of, the corresponding element described with reference to FIG. 6.

In the example of FIG. 9, an equalizer architecture includes a plurality of neural networks 905 that each output soft symbol estimations 930 (e.g., to an error correction component) based on input read information 925 from memory device (e.g., for an error correction component to perform an ECC operation on the output soft symbol estimations). Read information 925 may include cell voltage information 930, same-pillar neighbors voltage information 935, same-wordline neighbors voltage information 940, HD thresholds (e.g., all HD thresholds) of a wordline information 945, and wordline index information 950, among other examples.

Figure 10:
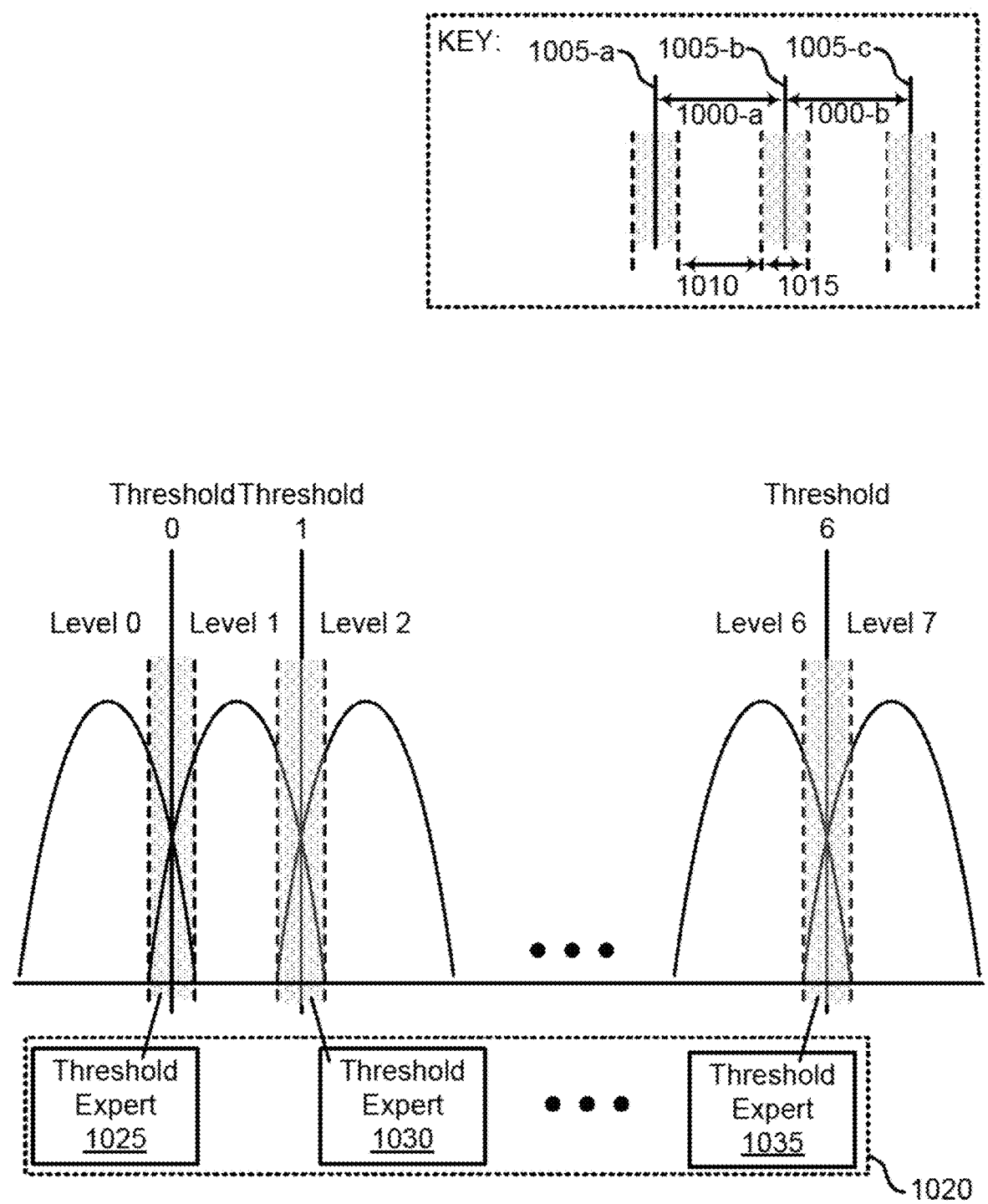
FIG. 10 shows an example of an example sample de-noising scheme according to aspects of the present disclosure.

In the example of FIG. 9, samples (e.g., read information samples, detected voltage information samples, etc.) may be passed through a specific threshold network, from the plurality of threshold networks 905, where the specific threshold network for each sample is selected by selection component 900 based on the sample (e.g., based on a weak decision range the sample resides in, as further described herein, for example, with reference to FIG. 10).

As described herein, each threshold expert of the plurality of threshold experts 905 may include a shallow machine learning model (e.g., each of first threshold expert 910, second threshold expert 915, third threshold expert 920, etc., may include a shallow threshold-expert machine learning model trained and configured to perform a classification task between two voltage states corresponding to specific weak decision range). That is, the shallow threshold networks described herein may perform binary classification operations for a particular weak decision range (e.g., as described in more detail herein, for example, with reference to FIG. 10). Such classification operations may be less complex relative to classification operations for several possible voltage states (e.g., as performed by more complex machine learning models such as, for example, neural network 600). Accordingly, due to reduced latency and memory parameters, various NAND architectures may support such equalization architectures implementing a plurality of threshold networks 905 (e.g., a plurality of shallow threshold-expert machine learning models each performing a respective classification operation between two corresponding voltage states).

In some cases, the example architecture of FIG. 9 may be referred to as a multiple threshold architecture. Such architectures may include multiple threshold expert models (e.g., such as first threshold expert 910, second threshold expert 915, third threshold expert 920, etc.). Each threshold expert model may be assigned per each hard decision (HD) threshold (e.g., as further described herein, for example, with reference to FIG. 10). For example, the multiple threshold architecture may include 15 threshold expert models, but the present disclosure is not limited thereto. Each sample is received by (e.g., and analyzed by, classified by, etc.) one of the threshold expert models out of the plurality of threshold experts 905 depending on a detected voltage of the sample. An equalizer treats the weak samples (e.g., samples within a weak decision range that are not readily classifiable by the equalizer into a voltage state). Each threshold expert model trains on relevant samples (e.g., classifies relevant samples received from a selection component) based on corresponding HD proximity.

FIG. 10 shows an example of an example sample denoising scheme according to aspects of the present disclosure. The example shown includes levels 1000, thresholds 1005, strong decision voltage ranges 1010, weak decision voltage range 1015, and plurality of threshold networks 1020. Plurality of threshold networks 1020 is an example of, or includes aspects of, the corresponding element described with reference to FIGS. 8 and 9. In one embodiment, plurality of threshold networks 1020 includes first threshold expert 1025, second threshold expert 1030, and third threshold expert 1035. Plurality of threshold networks 1020 may be included in, or implemented via, equalizer 213 as described with reference to FIG. 2. First threshold expert 1025 is an example of, or includes aspects of, the corresponding element described with reference to FIG. 9. Second threshold expert 1030 is an example of, or includes aspects of, the corresponding element described with reference to FIG. 9. Third threshold expert 1035 is an example of, or includes aspects of, the corresponding element described with reference to FIG. 9.

To read the information from a memory device, voltage of each cell is measured and the voltage level that was stored in the cell is inferred. The bits can then be recovered. There may be a tradeoff between the number of voltage levels and the memory reliability. The larger the number of bits per cell, the more information that can be stored on the device, where there are more bits in every cell. Alternatively, the voltages that represent different levels may be packed more tightly together, because within the same dynamic range, a larger number of distinguishable voltages is used. As a result, noise in the cell programming or cell reading has a larger chance of changing the voltage of a level to another voltage representing a different level, therefore rendering an error upon reading the cell.

There are multiple sources of noise in a memory device that can result in erroneous reading of the information, such as writing noise, interference noise, aging, and operation of reading. Writing noise is the voltage of a cell immediately after programming it differs from the intended voltage due to a programming procedure. Interference noise is a function of the voltage of a cell changing as a result of programming a different neighboring cell. Programming cells causes a disturbance that affects other cells. Aging is where there is an increase in noise the more times a device is written and read from. Additionally, the more time between programing of a cell, the more noise the cell will produce. Also, the operation of reading a cell can cause noise and disturbances.

In the example of FIG. 10, samples (e.g., read information samples, detected voltage information samples, etc.) may be passed through a threshold network (e.g., first threshold expert 1025, second threshold expert 1030, third threshold expert 1035, etc.) that is selected by a selection component from the plurality of threshold networks 1020. As described herein, a specific threshold network for each sample is selected (e.g., by selection component) based on characteristics (e.g., a detected value, such as detected voltage) of the sample. For instance, a threshold network is selected based on a weak decision range 1015 the sample resides in.

For instance, as described herein, memory devices (e.g., NAND flash memory devices) may allow several bits of data to be stored in each memory cell. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels (e.g., such as 'Level 0,' 'Level 1,' . . . 'Level 7').

To read the information from a memory device, voltage of each cell is measured and the voltage level (e.g., such as 'Level 0,' 'Level 1,' ... 'Level 7') that was stored in the cell is inferred. The bits can then be recovered. The larger the number of bits per cell, the more information that can be stored on the device. However, the voltages that represent different levels (e.g., voltages representing 'Level 0,' 'Level 1,' 'Level 7') for such cells may be packed more tightly together, because within the same dynamic range, a larger number of distinguishable voltages is used. As described herein, when information is read from a cell (e.g., a NAND cell), the read information may be corrupted with noise (e.g., depending on the characteristics of the medium), which may result in an ambiguous value of the read information (e.g., the read voltage level may be within some weak decision voltage range 1015 between two voltage values).

In the example of FIG. 10, eight levels 1000 are shown (e.g., 'Level 0,' 'Level 1,' . . . 'Level 7') that may be represented by three bits (e.g., '000'='Level 0;' '001'='Level 1;' ... '111'='Level 7'). HD thresholds 1005 may exist between two neighboring levels 1000. Moreover, within a dynamic range spanning 'Level 0' to 'Level 7,' strong decision ranges 1010 and weak decision ranges 1015 may exist. Strong decision ranges 1010 may refer to ranges (e.g., voltage ranges) where the level of a sample is readily determined (e.g., by a voltage detector). Weak decision ranges 1015 may include ranges surrounding a HD threshold 1005, where the level of a sample is not readily determined (e.g., by a voltage detector). For instance, a weak decision range 1015 may include values (e.g., voltage values) closely preceding and closely subsequent to HD thresholds 1005.

Generally, levels 1000 may be distinguishable based on HD thresholds 1005, and levels 1000 may include strong decision ranges 1010 and portions of weak decision ranges 1015. Read information (e.g., detected voltages) within a strong decision range 1010 may be readily classified as a corresponding level 1000 (e.g., by a voltage detector without the use of a threshold expert). Read information (e.g., detected voltages) within a weak decision range 1015 may be passed to a selection component, where the selection component may select a threshold network to classify the read information as one of the two neighboring levels 1000. In the example of FIG. 10, a HD threshold 1005-b may reside between a level 1000-a and a level 1000-b. A weak decision range 1015 may include the range between the level 1000-a and a level 1000-b where further analysis on the read information is implemented via a corresponding threshold network from the plurality of threshold networks 1020. As described herein, a weak decision range 1015 may include a range where read information for different values of the channel output are likely to overlap (e.g., such that a threshold network may be used to classify the read information as one of the two associated neighboring values, for improved accuracy and reliability).

Accordingly, strong samples, or samples within a strong decision range 1010 may have channel output estimated based on the voltage detector (e.g., without the use of a threshold expert, as the sample is within a strong decision range 1010 where accuracy of the estimated channel output is relatively high). However, weak samples, or samples within a weak decision range 1015 may have channel output estimated by a threshold network selected by a selection component (e.g., where the threshold network is selected based on a HD threshold classification operation associated with the weak decision range 1015 the detected read information resides in).

Further, as described herein, such equalization operations may be performed subsequent to ECC operation failure in order to generate an updated codeword for a subsequent ECC operation attempt. In cases where an ECC operation is successful, equalization operations need not necessarily be performed.

In an example scenario, first threshold network 1025 trains based on samples in the proximity of HD Threshold 0, second threshold expert 1030 trains based on samples in the proximity of HD Threshold 1, and so on (e.g., though third threshold expert 1035 that trains based on samples in the proximity of HD Threshold 6). Each threshold-expert model solves a binary classification task. During inference, each sample passes through one of the threshold expert models. As an example, pseudocode for single threshold mode is described below.

---
Single Threshold mode Pseudocode:
---
Let $MLE_\theta$ - the threshold model network
$\overline{info}$ = $MLE_\theta$ (f)
info - the information bits mini-batch per network use
$\overline{info}$ - the estimated inforamtion bits mini-batch at the read network output
f - feature vector
$\lambda_\theta$ - learning rate
Initialize parameter vector $\theta$
for each iteration do
    $\theta \leftarrow \theta - \lambda_\theta \nabla_\theta$ CrossEntropy(info, $\overline{info}$ )
end for
---

The neural network nature of the Threshold Models is just an example, any other types of machine-learning models could be used (decision trees, random forests, etc.). Embodiments of the present disclosure are based on multiple shallow threshold-expert machine learning models. Multiple threshold architectures include several machine-learning models, one per each HD threshold (e.g., or in some cases, as described herein, one threshold expert per subset of total HD thresholds spanning a given dynamic range). Each threshold network is a shallow machine-learning model, and each threshold network may solve binary classification tasks. During inference, each sample passes through one of the threshold models. The threshold network is selected by a selection component (e.g., a threshold model selection module), according to the memory cell's voltage and/or the closest HD threshold.

The Multiple Threshold architecture of the present disclosure results in a set of shallow machine learning models that may be operated with low memory usage (memory usage less than ECC operation memory usage) and low latency. The equalization model may be implemented in a firmware version. Therefore, the equalization model may be used by any NAND flash memory architectures.

The present disclosure reduces latency and improves accuracy, where each threshold expert model is shallow and includes a binary output. Additionally or alternatively, relevant samples are used for each training model, improving accuracy. For example, Table 1 shows an example examination of TLC and quadruple-level cell (QLC) data sets. Table 1 summarize the bit error rate (BER) reduction achieved for each data set.

TABLE 1

| Data set | Tran set | Test Set | BER reduction [%] |
| --- | --- | --- | --- |
| TLC | 50 blocks | 22 blocks | 54.08% |
| QLC | 73 blocks | 31 blocks | 17.8% |

FIG. 10 illustrates aspects of a selection component (e.g., a threshold model selection module, such as selection component 805 and selection component 900 described with reference to FIGS. 8 and 9). For instance, in a selection component, a threshold network is selected for each sample within a weak decision range 1015 (e.g., within a range 1015 between two states or between two 'Levels.' A threshold network may be selected that classifies between two states or levels (e.g., between two voltage states). In some cases, a weak decision range may be referred to as a range around a HD threshold (e.g., weak decision ranges 1015 may include and surround one of 'Threshold 0,' 'Threshold 1,' 'Threshold 6').

In an example scenario, the voltage of each sample is determined (e.g., via voltage detector 800). Then, for samples with voltage within a weak decision range 1015, an HD is determined based on the closest voltage (e.g., the closes voltage state) to the determined voltage of a sample. The features of the sample are then provided to the corresponding threshold module (e.g., the threshold network trained and configured to perform a classification operation for the weak decision range 1015 associated with the voltage of the sample determined by the voltage detector). An improved parameter of each sample may then be determined, as each sample may be classified by a threshold network trained and configured to classify samples within the specific weak decision range 1015 that includes the detected voltage of the sample. Moreover, due to reduced latency and memory parameters associated with the plurality of shallow threshold networks 1020, various NAND architectures may support such equalization architectures implementing the plurality of threshold networks 1020.

Moreover, the example of FIG. 10 is provided for illustrative purposes and is not intended to be limiting in terms of the scope of the present disclosure. FIG. 10 shows and example where a parameter such as level estimation may be determined, however other estimations may be used (e.g., such as like-bits, soft symbols, etc.). In another example embodiment of the present disclosure, the number of threshold networks may be reduced (e.g., as a threshold network may perform classification operations for two weak decision ranges 1015, for example). For instance, samples within an HD threshold behave similarly. Therefore, a same threshold model may be used for samples in different HD (e.g., weak decision range 1015) neighbors, reducing the number of threshold models in an equalization module. For example, a first threshold network 1025 may be used for classification operations associated with both weak decision range 1015 between 'Level 0' and 'Level 1,' as well as for weak decision range 1015 between 'Level 1' and 'Level 2.' In such an example, a second threshold network 1030 may be used for classification operations associated with both weak decision range 1015 between 'Level 2' and 'Level 3,' as well as for weak decision range 1015 between 'Level 3' and 'Level 4.'

Each threshold network may be a shallow neural network (e.g. where each shallow neural network may be trained and configured for a classification operation for different HD thresholds or different weak decision ranges 1015). Some embodiments of the present disclosure use a logistic regression model, but other architectures may be used. An accuracy-model simplicity trade-off may be obtained.

Accordingly, embodiments of the present disclosure can reduce the overall number of threshold networks and still reduce latency and memory usage (e.g., via usage of multiple shallow threshold-expert networks trained and configured for one or more certain classification operations, rather than usage of a single complex machine learning network that performs classification operations for a wide range of levels or states.

As described herein, the present disclosure includes the following embodiments.

A method for flash memory de-noising using machine learning models is described. Embodiments of the method are configured to receiving read information for a memory cell of a memory device, selecting a threshold network from a plurality of threshold networks based on the read information, wherein each of the threshold networks corresponds to at least one weak decision voltage range from a plurality of weak decision voltage ranges of the memory cell, and generating an improved memory channel output from the read information using the selected threshold network.

An apparatus for flash memory de-noising using machine learning models is described. The apparatus includes a processor, memory in electronic communication with the processor, and instructions stored in the memory. The instructions are operable to cause the processor to receive read information for a memory cell of a memory device, select a threshold network from a plurality of threshold networks based on the read information, wherein each of the threshold networks corresponds to at least one weak decision voltage range from a plurality of weak decision voltage ranges of the memory cell, and generate an improved memory channel output from the read information using the selected threshold network.

A non-transitory computer readable medium storing code for flash memory de-noising using machine learning models is described. In some examples, the code comprises instructions executable by a processor to: receive read information for a memory cell of a memory device, select a threshold network from a plurality of threshold networks based on the read information, wherein each of the threshold networks corresponds to at least one weak decision voltage range from a plurality of weak decision voltage ranges of the memory cell, and generate an improved memory channel output from the read information using the selected threshold network.

A system for flash memory de-noising using machine learning models is described. Embodiments of the system are configured to receiving read information for a memory cell of a memory device, selecting a threshold network from a plurality of threshold networks based on the read information, wherein each of the threshold networks corresponds to at least one weak decision voltage range from a plurality of weak decision voltage ranges of the memory cell, and generating an improved memory channel output from the read information using the selected threshold network.

In some examples, a number of the threshold networks is one less than a number of hard decision thresholds. Some examples of the method, apparatus, non-transitory computer readable medium, and system described above further include determining that the read information corresponds to a weak decision voltage range from the plurality of weak decision voltage ranges, wherein the threshold network is selected based on the determination. Some examples of the method, apparatus, non-transitory computer readable medium, and system described above further include transmitting the read information to the selected threshold network. Some examples further include generating an improved value of the channel output.

In some examples, each of the weak decision voltage ranges comprises a region between two hard decision thresholds where voltage information for different values of the channel output are likely to overlap. In some examples, the weak decision voltage ranges are separated from each other by a plurality of strong decision voltage ranges, and wherein each of the strong decision voltage ranges corresponds to a value of the channel output. In some examples, each of the threshold networks is trained to operate using read information corresponding to a specific weak decision voltage range.

Some examples of the method, apparatus, non-transitory computer readable medium, and system described above further include reading a plurality of memory cells including the memory cell. Some examples further include generating a codeword based on the reading. Some examples further include performing an ECC operation. Some examples further include determining that the ECC operation failed. Some examples further include generating an updated codeword based on the improved memory channel output.

In some examples, the read information comprises one or more of a voltage information of the memory cell, a voltage information of a cell in a neighboring wordline of the memory cell, a voltage of a cell in a same wordline as the memory cell, one or more HD thresholds of a wordline, one or more SD thresholds of a wordline, and a wordline index. Some examples of the method, apparatus, non-transitory computer readable medium, and system described above further include generating LLRs based on the improved memory channel output.

Some examples of the method, apparatus, non-transitory computer readable medium, and system described above further include receiving second read information for a second memory cell of the memory device. Some examples further include determining that the second read information corresponds to a second weak decision voltage range from the plurality of weak decision voltage ranges, wherein the second weak decision voltage range is different from the weak decision voltage range. Some examples further include determining that a second threshold network corresponds to the second weak decision voltage range. Some examples further include selecting the second threshold network from the plurality of threshold networks, wherein the second threshold network is different from the threshold network.

Some examples of the method, apparatus, non-transitory computer readable medium, and system described above further include receiving a read command from a host device. Some examples further include reading voltage information from the memory cell in response to the read command, wherein the read information comprises the voltage information. Some examples further include transmitting a response to the host device based on the codeword.

An apparatus for flash memory de-noising using machine learning models is described. Embodiments of the apparatus are configured to a voltage detector configured to detect voltage information from a memory cell, a plurality of threshold networks configured to estimate a channel output of the memory cell based on the detected voltage information, wherein each of the threshold networks corresponds to a different weak decision voltage range from a plurality of weak decision voltage ranges, and a selection component configured to select a threshold network from the plurality of threshold networks based on the detected voltage information.

An system for flash memory de-noising using machine learning models, comprising: a voltage detector configured to detect voltage information from a memory cell, a plurality of threshold networks configured to estimate a channel output of the memory cell based on the detected voltage information, wherein each of the threshold networks corresponds to a different weak decision voltage range from a plurality of weak decision voltage ranges, and a selection component configured to select a threshold network from the plurality of threshold networks based on the detected voltage information.

A method of manufacturing an apparatus for flash memory de-noising using machine learning models is described. The method includes a voltage detector configured to detect voltage information from a memory cell, a plurality of threshold networks configured to estimate a channel output of the memory cell based on the detected voltage information, wherein each of the threshold networks corresponds to a different weak decision voltage range from a plurality of weak decision voltage ranges, and a selection component configured to select a threshold network from the plurality of threshold networks based on the detected voltage information.

A method of using an apparatus for flash memory de-noising using machine learning models is described. The method includes a voltage detector configured to detect voltage information from a memory cell, a plurality of threshold networks configured to estimate a channel output of the memory cell based on the detected voltage information, wherein each of the threshold networks corresponds to a different weak decision voltage range from a plurality of weak decision voltage ranges, and a selection component configured to select a threshold network from the plurality of threshold networks based on the detected voltage information.

Some examples of the apparatus, system, and method described above further include an error correction component configured to perform an ECC operation on a codeword based on the channel output. In some examples, the selection component is further configured to determine that the detected voltage information corresponds to a weak decision voltage range from the plurality of weak decision voltage ranges, wherein the threshold network is selected based on the determination.

In some examples, the each of the plurality of threshold networks is further configured to generate an output value that indicates whether the detected voltage information corresponds to a first value of the channel output or a second value of the channel output. In some examples, each of the threshold networks is trained to operate on read information corresponding to a specific weak decision voltage range. In some examples, each of the weak decision voltage ranges comprises a region between two hard decision threshold where voltage information for different values of the channel output are likely to overlap.

A system for flash memory de-noising using machine learning models, comprising: a memory device comprising a plurality of memory cells arranged in a plurality of wordlines and a plurality of bitlines and a memory controller comprising a processor. The memory controller is configured to receive read information for a memory cell of a memory device; select a threshold network from a plurality of threshold networks based on the read information, wherein each of the threshold networks corresponds to a different weak decision voltage range from a plurality of weak decision voltage ranges; generate an estimation of a channel output from the read information using the selected threshold network.

Some examples of the apparatus, system, and method described above further include a host device configured to transmit a read command to the memory device, wherein the read information is read by the memory controller based on the read command, and receive a response from the memory controller based at least in part on the estimate of the channel output.

The description and drawings described herein represent example configurations and do not represent all the implementations within the scope of the claims. For example, the operations and steps may be rearranged, combined or otherwise modified. Also, structures and devices may be represented in the form of block diagrams to represent the relationship between components and avoid obscuring the described concepts. Similar components or features may have the same name but may have different reference numbers corresponding to different figures.

Some modifications to the disclosure may be readily apparent to those skilled in the art, and the principles defined herein may be applied to other variations without departing from the scope of the disclosure. Thus, the disclosure is not limited to the examples and designs described herein, but is to be accorded the broadest scope consistent with the principles and novel features disclosed herein.

The described systems and methods may be implemented or performed by devices that include a general-purpose processor, a digital signal processor (DSP), an application specific integrated circuit (ASIC), a field programmable gate array (FPGA) or other programmable logic device, discrete gate or transistor logic, discrete hardware components, or any combination thereof. A general-purpose processor may be a microprocessor, a conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Thus, the functions described herein may be implemented in hardware or software and may be executed by a processor, firmware, or any combination thereof. If implemented in software executed by a processor, the functions may be stored in the form of instructions or code on a computer-readable medium.

Computer-readable media includes both non-transitory computer storage media and communication media including any medium that facilitates transfer of code or data. A non-transitory storage medium may be any available medium that can be accessed by a computer. For example, non-transitory computer-readable media can comprise random access memory (RAM), read-only memory (ROM), electrically erasable programmable read-only memory (EEPROM), compact disk (CD) or other optical disk storage, magnetic disk storage, or any other non-transitory medium for carrying or storing data or code.

Also, connecting components may be properly termed computer-readable media. For example, if code or data is transmitted from a web site, server, or other remote source using a coaxial cable, fiber optic cable, twisted pair, digital subscriber line (DSL), or wireless technology such as infrared, radio, or microwave signals, then the coaxial cable, fiber optic cable, twisted pair, DSL, or wireless technology are included in the definition of medium. Combinations of media are also included within the scope of computer-readable media.

In this disclosure and the following claims, the word "or" indicates an inclusive list such that, for example, the list of X, Y, or Z means X or Y or Z or XY or XZ or YZ or XYZ. Also the phrase "based on" is not used to represent a closed set of conditions. For example, a step that is described as "based on condition A" may be based on both condition A and condition B. In other words, the phrase "based on" shall be construed to mean "based at least in part on." Also, the words "a" or "an" indicate "at least one."

What is claimed is:

1. A method for flash memory de-noising, comprising:
receiving read information for a memory cell of a memory device;
selecting a threshold expert from a plurality of threshold experts based on the read information, wherein each of the threshold experts corresponds to at least one weak decision voltage range from a plurality of weak decision voltage ranges of the memory cell; and
generating a modified memory channel output from the read information using the selected threshold expert.

2. The method of claim 1, wherein:
a number of the threshold experts is one less than a number of hard decision thresholds.

3. The method of claim 1, further comprising:
determining that the read information corresponds to a weak decision voltage range from the plurality of weak decision voltage ranges, wherein the threshold expert is selected based on the determination.

4. The method of claim 1, further comprising:
transmitting the read information to the selected threshold expert; and
generating an improved value of the channel output.

5. The method of claim 1, wherein:
each of the weak decision voltage ranges comprises a region between two hard decision thresholds where voltage information for different values of the channel output are likely to overlap.

6. The method of claim 1, wherein:
the weak decision voltage ranges are separated from each other by a plurality of strong decision voltage ranges, and wherein each of the strong decision voltage ranges corresponds to a value of the channel output.

7. The method of claim 1, wherein:
each of the threshold experts is trained to operate using read information corresponding to a specific weak decision voltage range.

8. The method of claim 1, further comprising:
reading a plurality of memory cells including the memory cell;
generating a codeword based on the reading;
performing an error correction code (ECC) operation;
determining that the ECC operation failed; and
generating an updated codeword based on the modified memory channel output.

9. The method of claim 1, wherein:
the read information comprises one or more of a voltage information of the memory cell, a voltage information of a cell in a neighboring wordline of the memory cell, a voltage of a cell in a same wordline as the memory cell, one or more hard decision (HD) thresholds of a wordline, one or more soft decision (SD) thresholds of a wordline, and a wordline index.

10. The method of claim 1, further comprising:
generating log likelihood ratio (LLRs) based on the modified memory channel output.

11. The method of claim 1, further comprising:
receiving second read information for a second memory cell of the memory device;
determining that the second read information corresponds to a second weak decision voltage range from the plurality of weak decision voltage ranges, wherein the second weak decision voltage range is different from the weak decision voltage range;
determining that a second threshold expert corresponds to the second weak decision voltage range; and selecting the second threshold expert from the plurality of threshold experts, wherein the second threshold expert is different from the threshold expert.

12. The method of claim 1, further comprising:
receiving a read command from a host device;
reading voltage information from the memory cell in response to the read command, wherein the read information comprises the voltage information; and
transmitting a response to the host device based on a codeword.

13. A system comprising:
a memory device comprising a plurality of memory cells arranged in a plurality of wordlines and a plurality of bitlines; and
a memory controller comprising a processor, wherein the memory controller is configured to:
 receive read information for a memory cell of the memory device;
 select a threshold expert from a plurality of threshold experts based on the read information, wherein each of the threshold experts corresponds to a different weak decision voltage range from a plurality of weak decision voltage ranges; and
 generate an estimate of a channel output from the read information using the selected threshold expert.

14. The system of claim 13, further comprising:
a host device configured to:
 transmit a read command to the memory device, wherein the read information is read by the memory controller based on the read command; and
 receive a response from the memory controller based at least in part on the estimate of the channel output.

15. A method for flash memory de-noising, comprising:
reading a memory cell to obtain read information;
generating a codeword based on the reading;
performing an error correction code (ECC) operation on the codeword;
determining that the ECC operation failed;
selecting a threshold expert from a plurality of threshold experts based on the read information and based on the determination that the ECC operation failed, wherein each of the threshold experts corresponds to at least one weak decision voltage range from a plurality of weak decision voltage ranges of the memory cell;
generating a modified memory channel output from the read information using the selected threshold expert; and
generating an updated codeword based on the modified memory channel output.

* * * * *